United States Patent [19]

Ryou

[11] Patent Number: 5,492,850
[45] Date of Patent: Feb. 20, 1996

[54] METHOD FOR FABRICATING A STACKED CAPACITOR CELL IN SEMICONDUCTOR MEMORY DEVICE

[75] Inventor: Eui K. Ryou, Kyoungki, Rep. of Korea

[73] Assignee: Hyundai Electronics Industries Co., Ltd., Kyoungki, Rep. of Korea

[21] Appl. No.: 366,827

[22] Filed: Dec. 30, 1994

[30] Foreign Application Priority Data

Dec. 31, 1993 [KR] Rep. of Korea .................. 31911

[51] Int. Cl.⁶ ...................... H01L 21/70; H01L 27/00
[52] U.S. Cl. ................ 437/52; 437/60; 437/919
[58] Field of Search ................. 437/47, 52, 60, 437/919

[56] References Cited

U.S. PATENT DOCUMENTS 5,389,560  2/1995  Park ........................... 437/52
5,403,766  4/1995  Miyaka ....................... 437/52

Primary Examiner—Olik Chaudhuri
Assistant Examiner—H. Jey Tsai
Attorney, Agent, or Firm—Merchant, Gould, Smith, Edell, Welter & Schmidt

[57] ABSTRACT

There are disclosed a semiconductor memory device and a method for fabrication thereof. The semiconductor memory device comprises a storage electrode connected with a source region of a MOSFET and formed with a wider area than that of the mask therefor, having a structure which is comprised of a spacer-shaped hollow cylinder of impurity-doped polysilicon containing three separate solid cylinders of impurity-doped polysilicon therein, a column filling the contact hole, and a disc-like plate, the spacer-shaped hollow cylinder and the three separate cylinders standing on the disc-like plate from which the column is extended toward the active region. It has an advantage of increasing the efficient area of a storage electrode of a semiconductor device, thereby improving the capacitance. In addition, it becomes more reliable and thus, its price increases.

11 Claims, 5 Drawing Sheets

METHOD FOR FABRICATING A STACKED CAPACITOR CELL IN SEMICONDUCTOR MEMORY DEVICE

BACKGROUND OF THE INVENTION

1. Field of the Invention

The present invention relates, in general, to a semiconductor memory device and a method for fabrication thereof and, more particularly, to an improvement in securing capacitance and reliability, along with the method.

2. Description of the Prior Art

Important factors associated with the integration of a DRAM, a universal semiconductor memory device, are the reduction in cell area and charge storage capacitance. That is to say, the high integration of a semiconductor integrated circuit is accomplished with a great diminution of the unit area of chips and cells yet with securing sufficient charge storage capacitance. Accordingly, highly precise process techniques have been required for the sufficiency of charge storage capacitance of a cell as well as for the reliability of a cell.

In order to better understand the background of the present invention, a conventional semiconductor memory device will be generally described, along with its fabrication process, in connection with FIG. 1.

As shown in FIG. 1, the conventional semiconductor memory device is comprised broadly of a MOSFET and a capacitor. For the MOSFET, a semiconductor substrate 1 is first provided with a field oxide layer 2, and a gate oxide layer 3 is grown thereon. Subsequently, polysilicon is deposited for implantation of dopants and a pattern of a gate electrode 4 and a word line 4' is formed. And then, an oxide spacer 5 at a side wall of the gate electrode 4 is used to form active regions 6, 6' of lightly doped drain (LDD) structure, whereby the electrical properties of the MOSFET can be improved. For the capacitor, a blanket insulation oxide layer 7 is first formed over the MOSFET structure to planarize it, and then selectively etched to form a contact hole which exposes the active region 6 therethrough. Thereafter, impurity-doped polysilicon is deposited such that it comes into contact with the active region 6, and then patterned to form a storage electrode 11. On the storage electrode is grown a nitride-oxide (hereinafter referred to as "NO") or oxide-nitride-oxide (hereinafter referred to as "ONO") composite dielectric layer, on which impurity-doped polysilicon is deposited and then patterned for a plate electrode 16.

Now, such conventional semiconductor memory device has proved to be unsuitable for the high integration of a semiconductor device because it is virtually impossible with this structure for a storage electrode to secure sufficient capacitance and maintain the high integration.

SUMMARY OF THE INVENTION

Therefore, an object of the present invention is to overcome the above problems encountered in the prior art and to provide a method for the fabrication of a semiconductor device, capable of securing sufficient capacitance of storage electrode.

Another object of the present invention is to provide a semiconductor device, improved in capacitance of storage electrode and in reliability.

In accordance with an aspect of the present invention, the above object can be accomplished by providing a process for the fabrication of a semiconductor memory device, comprising the steps of: (A) growing a field oxide layer in a LOCOS step on a semiconductor wafer provided with a P-well and forming a MOSFET having an active region of LDD structure; (B) depositing a blanket insulating oxide film over the resulting structure, planarizing the blanket insulating oxide film by etching, depositing a barrier silicon nitride and a first storage electrode polysilicon in sequence, and selectively etching the first storage electrode polysilicon, the barrier silicon nitride and the insulating oxide film with a mask for contact hole, to form a groove; (C) depositing polysilicon over the resulting structure, subjecting the polysilicon to anisotropic etching, to form a polysilicon spacer at a side wall of the groove, etching the insulating oxide film, to form a contact hole with both the first storage electrode polysilicon and the polysilicon spacer serving as a mask, forming an impurity-doped, second storage electrode polysilicon on the resulting structure such that it is connected with a source region of the MOSFET, coating a photosensitive film on the second storage electrode polysilicon, and exposing the photosensitive film to light twice with the mask for contact hole and a mask for storage electrode, to form a photosensitive film pattern; (D) selectively etching the second storage polysilicon by use of the photosensitive film pattern as a mask, to form a pattern of second storage polysilicon, removing the photosensitive film pattern, depositing a blanket oxide film over the pattern of second storage polysilicon and subjecting the blanket oxide film to anisotropic etching, to form a sacrificial oxide spacer at a side wall of the pattern of second storage electrode polysilicon; (E) selectively etching the first storage electrode polysilicon and the pattern of second storage electrode polysilicon until the barrier silicon nitride is exposed with the sacrificial oxide spacer serving as a mask; (F) depositing a third storage electrode polysilicon, to cover the sacrificial oxide spacer completely, subjecting the third storage electrode polysilicon to anisotropic etching to such an extent that an upper portion of the sacrificial oxide spacer is exposed, so as to form a pattern of third storage electrode polysilicon at a flank of the sacrificial oxide spacer, said pattern of third storage electrode polysilicon having a structure comprised of a spacer-shaped hollow cylinder and a spacer-shaped solid cylinder present in the central area of the spacer-shaped hollow cylinder and over the contact hole, and removing the sacrificial oxide spacer by wet etching with the barrier silicon nitride serving as an etch stopper; and (G) growing a dielectric layer along the exposed surface of the patterns of the first, second and third storage electrode polysilicon, depositing an impurity-doped polysilicon, and patterning the impurity-doped polysilicon, to form a plate electrode.

In accordance with another aspect of the present invention, there is provided a semiconductor memory device, comprising a storage electrode connected with a source region of a MOSFET and formed with a wider area than that of the mask therefor, having a structure which is comprised of a spacer-shaped hollow cylinder of impurity-doped polysilicon containing three separate solid cylinders of impurity-doped polysilicon therein, a column filling the contact hole, and a disc-like plate, the spacer-shaped hollow cylinder and the three separate cylinders standing on the disc-like plate from which the column is extended toward the active region.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

Figure 1:
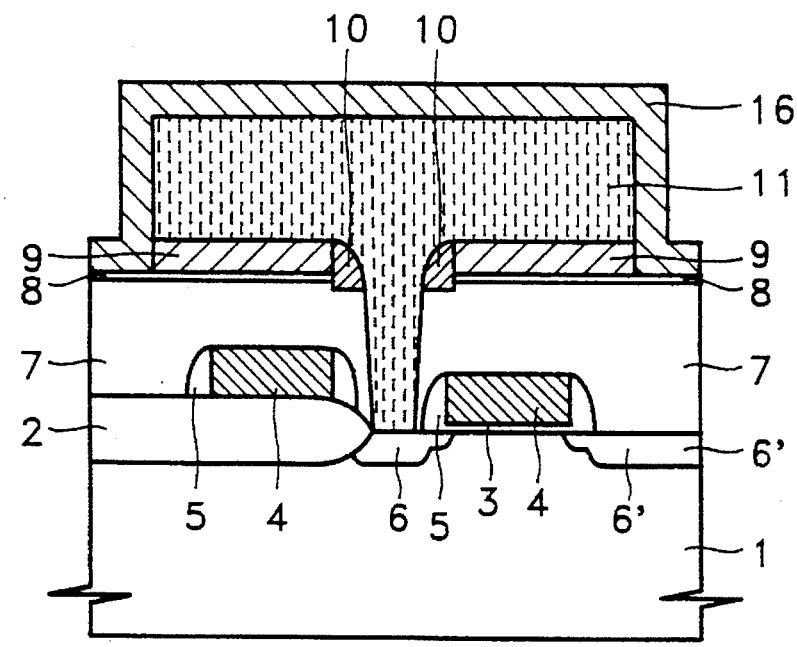
FIG. 1 is a schematic cross sectional view showing a semiconductor memory device according to a prior art technique.

The application of the preferred embodiments of the present invention is best understood with reference to the accompanying drawings, wherein like reference numerals are used for like and corresponding parts, respectively.

Figure 2:
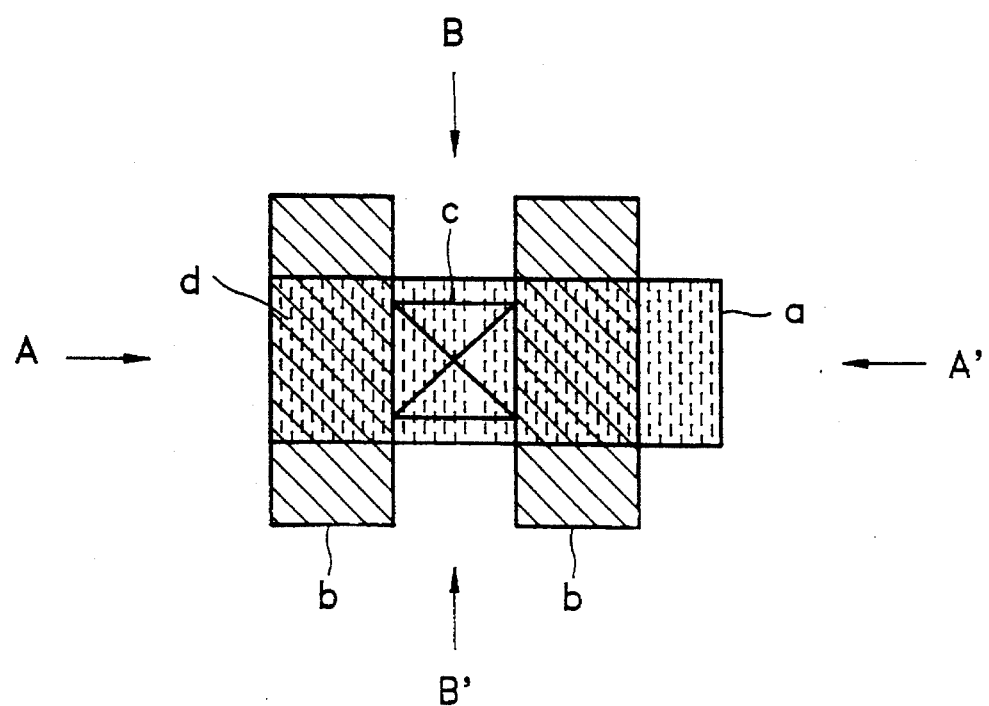
FIG. 2 is a layout showing masks according to the present invention.

Referring initially to FIG. 2, there is shown a series of masks for fabricating a semiconductor memory device according to the present invention, comprising a mask for isolation region a, masks for gate electrode and word line b, a mask for contact hole c, and masks for storage electrode d.

With reference to FIGS. 3A through 3D, there are illustrated the preferred steps for fabricating a semiconductor memory device according to a first embodiment of the present invention, from a view taken generally through line A—A' of FIG. 2.

Figure 3A:
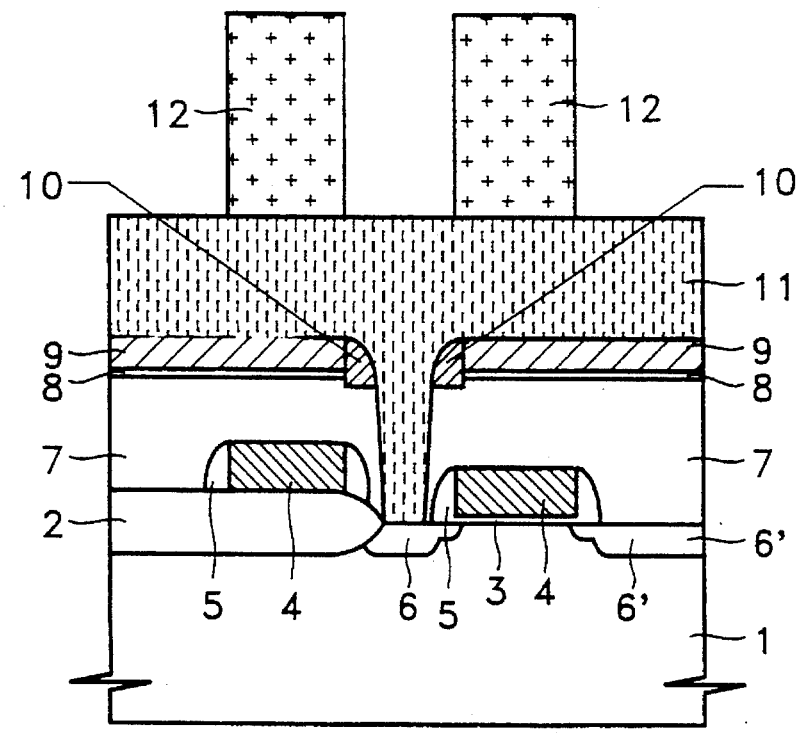
FIGS. 3A through 3D are schematic cross sectional views illustrating a method for the fabrication of a semiconductor device, according to a first embodiment of the present invention, taken generally through line A—A' of FIG. 2.

As shown in FIG. 3A, a MOSFET structure is fabricated in a semiconductor wafer, and then provided with a photosensitive film pattern for a storage electrode.

For the MOSFET structure, on a semiconductor wafer 1 provided with a P-well, there is first grown a field oxide 2 in a LOCOS process. Then, a gate oxide 3 and a polysilicon for gate electrode and word line are deposited, without time delay. Subsequently, this polysilicon is doped with dopants and etched by use of the masks for gate electrode and word line b of FIG. 2, to form a pattern of gate electrode 4 and word line 4'. Thereafter, active regions 6, 6' of LDD structure ale formed by implanting n-type ions at a low density into the semiconductor wafer 1, forming an oxide spacer 5 at a side wall of the gate electrode and implanting n-type ions at a relatively high density into the semiconductor wafer 1. As a result, a MOSFET is obtained.

Next, the MOSFET structure is covered with a blanket isolation oxide film 7 which is then subjected to etching with the objective of planarizing itself. Subsequently, a blanket barrier silicon nitride 8 is deposited on the planarized isolation oxide film 7, followed by deposition of a first storage electrode polysilicon 9 on the barrier silicon nitride layer 8. Using the mask for contact hole c of FIG. 2, the first storage electrode polysilicon layer 9, the silicon nitride layer 8 and a portion of the isolation oxide film 7 are removed at a predetermined portion, to form a groove. Then, a blanket polysilicon is deposited over the resulting structure and subjected to anisotropic etching, to form a polysilicon spacer 10 at a side wall of the groove. Using the first storage electrode polysilicon layer 9 and the polysilicon spacer 10 as an etch stopper, the exposed isolation oxide film 7 is selectively etched to form a contact hole which exposes an area of the source region 6 of the MOSFET therethrough. Following this, an impurity-doped, second storage electrode polysilicon 11 is deposited such that it comes into contact with the source region 6 of the MOSFET. A photosensitive film is deposited, exposed to light with the mask for contact hole c and the mask for storage electrode d, such as that effected by double light exposure, and developed, to form a photosensitive film pattern 12.

The impurity-doped, second storage electrode polysilicon layer 11 may be made by depositing pure polysilicon and implanting dopants thereunto. Both the first storage electrode polysilicon layer 9 and the polysilicon spacer 10 may be made of pure polysilicon in order to improve etch selectivity between them and the oxide film 7. In this case, the insulation oxide film 7 is doped with dopants.

Figure 3B:
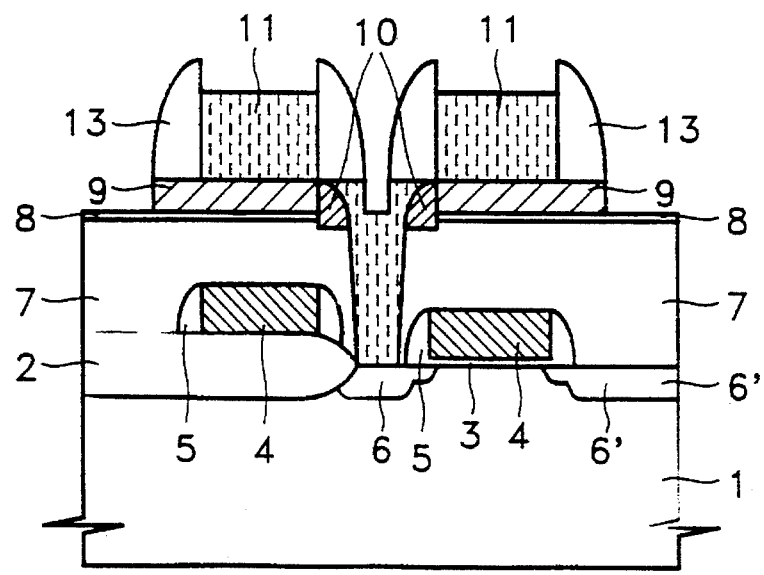

FIG. 3B is a cross section after the second storage electrode polysilicon 11 is selectively etched by use of the photosensitive film 12 as a barrier, to form a pattern of the second storage electrode polysilicon 11 which consists of two separate solid cylinders and one column filling the contact hole, followed by formation of a sacrificial oxide spacer 13 at a side wall of the separate solid cylinder. For the sacrificial oxide spacer 13, the photosensitive film 12 is first removed, and then, an oxide is deposited so thickly that it covers the solid cylinders of the pattern of the second storage electrode polysilicon 11 sufficiently when subjected to anisotropic etching. In this figure, there is also illustrated formation of a pattern of the first storage electrode polysilicon 8. The pattern of the first storage electrode polysilicon 9 is formed by an etching process using the sacrificial oxide spacer 13 as a mask. That is, the first storage electrode polysilicon layer 9 and the column filling the contact hole are selectively etched until the barrier silicon nitride 8 is exposed with the sacrificial oxide film spacer 13 serving as a mask.

Figure 3C:
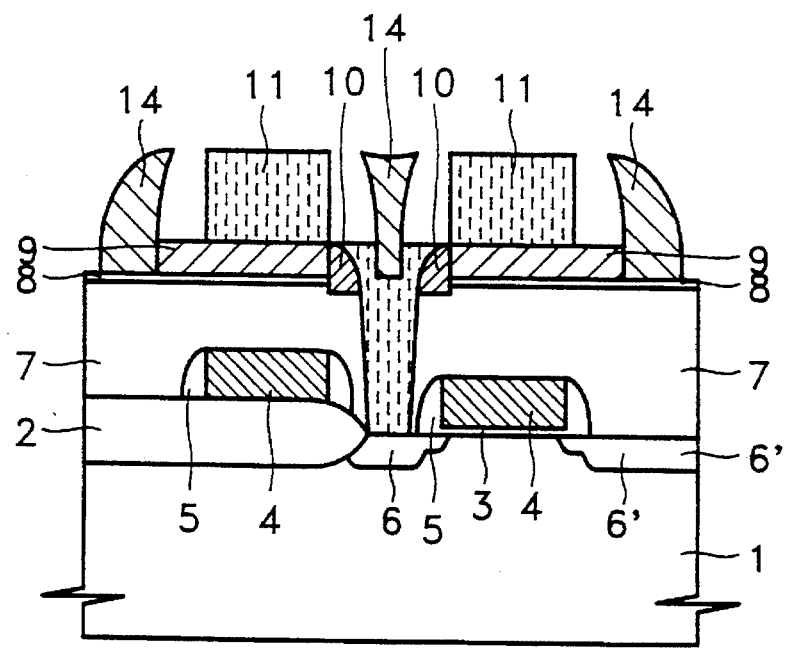

FIG. 3C is a cross section after a third storage electrode polysilicon 14 is deposited in such a thickness as to cover the sacrificial oxide film spacer 13 completely and when subjected to anisotropic etching an upper portion of the sacrificial oxide film spacer 13 is exposed to form a pattern of the third storage electrode polysilicon 14 at a flank of the sacrificial oxide film spacer 13, followed by removal of the sacrificial oxide film spacer 13. This removal of the sacrificial oxide film spacer 13 is accomplished by wet etching with the barrier silicon nitride layer 8 serving as an etch stopper to the chemical etchant used. As shown in this figure, the pattern of the third storage electrode polysilicon 14 is composed of a spacer-shaped hollow cylinder and a spacer-shaped solid cylinder which is positioned in the central area of the spacer-shaped hollow cylinder. The spacer-shaped solid cylinder is between the two separate solid cylinders of the second storage electrode polysilicon 14 at a distance therefrom.

Figure 3D:
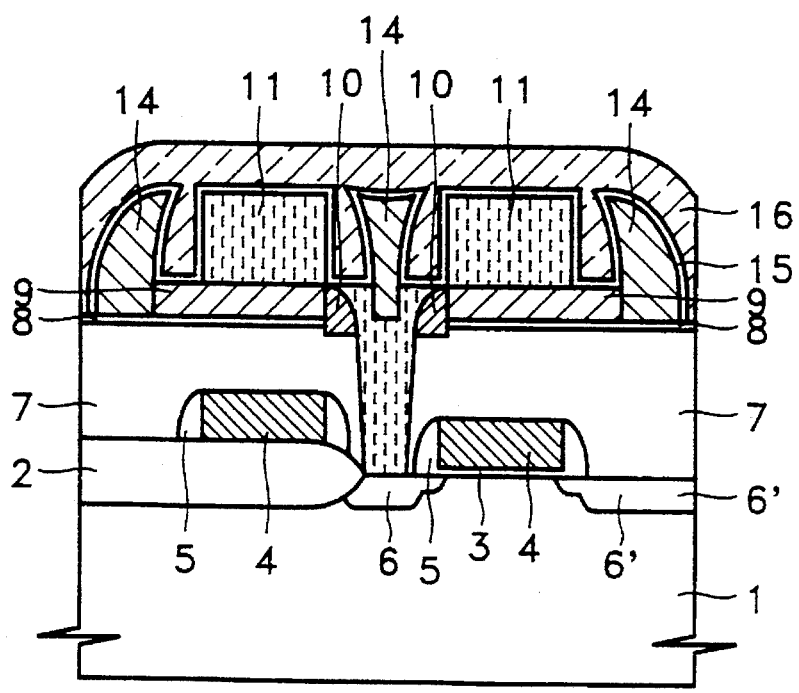

FIG. 3D is a cross section after an NO or ONO composite dielectric layer 15 is grown along the exposed surface of the patterns of the first, second and third storage electrode polysilicons 8, 11, 14, followed by formation of a plate electrode 16. The plate electrode 16 is formed by depositing an impurity-doped polysilicon and patterning the polysilicon. Through subsequent annealing processes comprising growing the dielectric layer 15, dopants are diffused into the pattern of the first storage electrode polysilicon 9 and the polysilicon spacer 10 and thus, they can ultimately play a role of storage electrode along with the storage electrode polysilicon 11. As a result, a semiconductor memory device with a novel structure is obtained. Instead of the NO or ONO composite dielectric layer 15, tantalum oxide ($Ta_2O_3$) dielectric layer may be employed. The plate electrode 16 may also be prepared from polycide or similar conductive material. Consequently, the storage electrode is made of impurity-doped polysilicon which is comprised of a spacer-shaped hollow cylinder containing three separate solid cylinders therein, a column filling the contact hole, and a disc-like plate, the spacer-shaped hollow cylinder and the three separate cylinders standing on the disc-like plate from which the column is extended toward the active region.

Figure 3E:
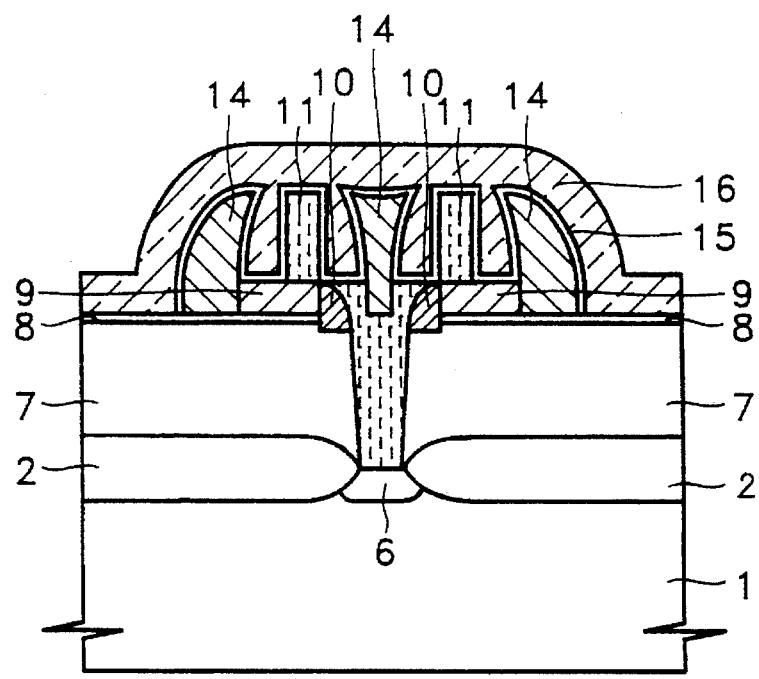
FIG. 3E is a schematic cross sectional view showing the semiconductor device according to the first embodiment of the present invention, taken generally through line B—B' of FIG. 2.

FIG. 3E shows a cross section of the semiconductor memory device fabricated according to the first embodiment of the present invention, taken through line B—B' of FIG. 2.

Figure 4:
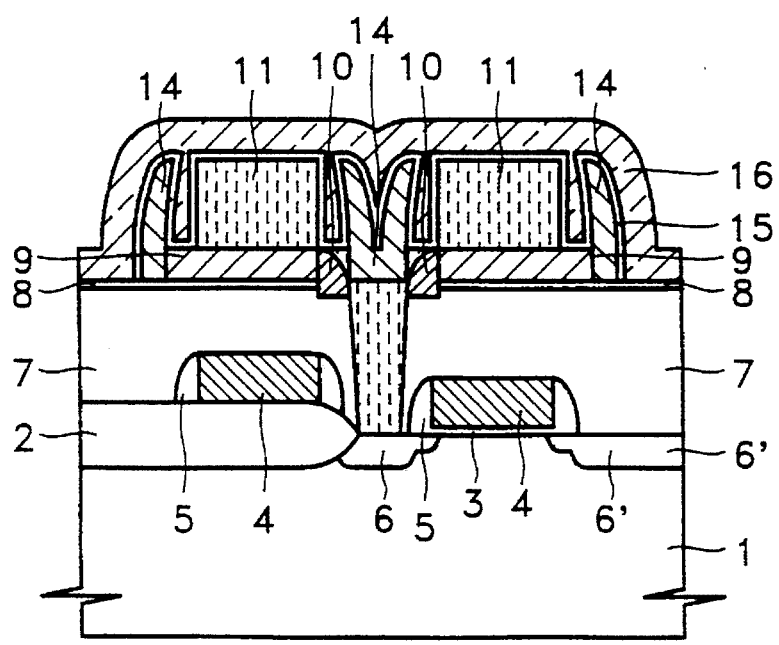
FIG. 4 is a schematic cross sectional view showing a semiconductor device according to a second embodiment of the present invention.

Turning now to FIG. 4, there is shown a semiconductor memory device according to a second embodiment of the present invention. As shown in this figure, the spacer-shaped solid cylinder of the third storage electrode polysilicon 14 over the contact is split and thus, the storage electrode has increased efficient area. This is accomplished by controlling the thicknesses of the sacrificial oxide film spacer 13 of FIG. 3B and the third storage electrode polysilicon 14 of FIG. 3C.

Figure 5:
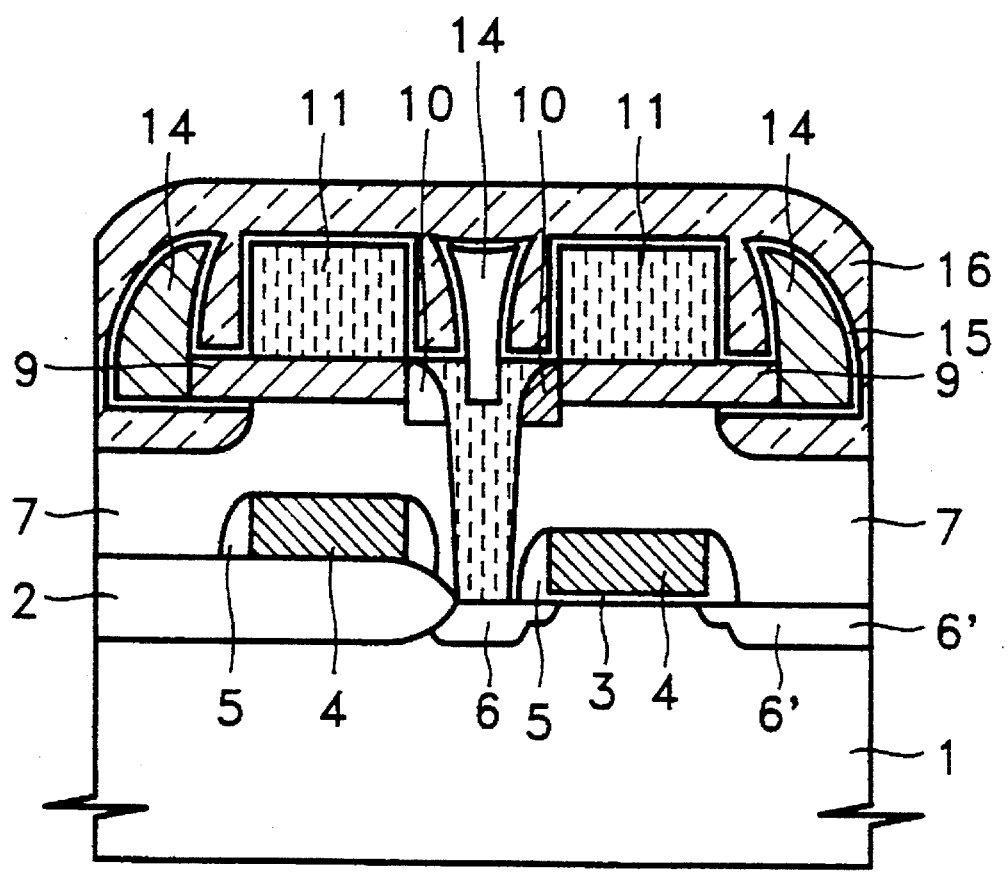
FIG. 5 is a schematic cross sectional view showing a semiconductor device according to a third embodiment of the present invention.

With reference to FIG. 5, there is shown a semiconductor memory device according to a third embodiment of the present invention, that is fabricated without using the barrier silicon nitride of FIG. 3A. Accordingly, when the sacrificial oxide film spacer 13 of FIG. 3C is etched by a chemical etchant, the storage electrode is undercut, as shown in FIG. 6. Consequently, the storage electrode is increased in efficient area.

As described hereinbefore, the semiconductor memory device according to the present invention has a storage electrode connected with a source region of a MOSFET and formed with a wider area than that of the mask therefor, having a structure which is comprised of a spacer-shaped hollow cylinder of impurity-doped polysilicon containing three separate solid cylinders of impurity-doped polysilicon therein, a column filling the contact hole, and a disc-like plate, the spacer-shaped hollow cylinder and the three separate cylinders standing on the disc-like plate from which the column is extended toward the active region. Accordingly, the method according to the present invention brings about an advantage of increasing the efficient area of storage electrode of semiconductor device, thereby improving the capacitance. In addition, as apparent from the improvement of the capacitance, the resulting device becomes more reliable.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for the fabrication of a semiconductor memory device, comprising the steps of:

(A) growing a field oxide layer in a LOCOS step on a semiconductor wafer provided with a P-well and forming a MOSFET having an active region of LDD structure;

(B) depositing a blanket insulating oxide film over the resulting structure after step (A), planarizing the blanket insulating oxide film by etching, depositing a barrier silicon nitride and a first storage electrode polysilicon in sequence, and selectively etching the first storage electrode polysilicon, the barrier silicon nitride and the insulating oxide film with a mask for contact hole, to form a groove;

(C) depositing a polysilicon layer over the resulting structure after step (B), subjecting the polysilicon layer to anisotropic etching, to form a polysilicon spacer at a side wall of the groove, etching the insulating oxide film, to form a contact hole with both the first storage electrode polysilicon and the polysilicon spacer serving as a mask, then forming an impurity-doped, second storage electrode polysilicon such that it is connected with a source region of the MOSFET, coating a photosensitive film on the second storage electrode polysilicon, and exposing the photosensitive film to light twice with a mask for contact hole and a mask for storage electrode, to form a photosensitive film pattern;

(D) selectively etching the second storage polysilicon by use of the photosensitive film pattern as a mask, to form a pattern of second storage polysilicon, removing the photosensitive film pattern, depositing a blanket oxide film over the pattern of second storage polysilicon and subjecting the blanket oxide film to anisotropic etching, to form a sacrificial oxide spacer at a side wall of the pattern of second storage electrode polysilicon;

(E) selectively etching the first storage electrode polysilicon and the pattern of second storage electrode polysilicon until the barrier silicon nitride is exposed with the sacrificial oxide spacer serving as a mask;

(F) depositing a third storage electrode polysilicon, to cover the sacrificial oxide spacer completely, subjecting the third storage electrode polysilicon to anisotropic etching to such an extent that an upper portion of the sacrificial oxide spacer is exposed, so as to form a pattern of third storage electrode polysilicon at a flank of the sacrificial oxide spacer, said pattern of third storage electrode polysilicon having a structure comprised of a spacer-shaped hollow cylinder and a spacer-shaped solid cylinder present in the central area of the spacer-shaped hollow cylinder and over the contact hole, and removing the sacrificial oxide spacer by wet etching with the barrier silicon nitride serving as an etch stopper; and (G) growing a dielectric layer on the first, second and third storage electrode polysilicons, depositing an impurity-doped polysilicon, and patterning the impurity-doped polysilicon, to form a plate electrode.

2. A process in accordance with claim 1, wherein said polysilicon spacer is formed by depositing the blanket polysilicon after the selective etching of the insulating oxide film for the contact hole, and subjecting the blanket polysilicon to anisotropic etching to fill an edge portion of an upper portion of the contact hole, with the aim of preventing discontinuity in the pattern of the third storage electrode polysilicon, where such discontinuity may be generated when the third storage electrode polysilicon is etched.

3. A process in accordance with claim 1, wherein said second storage electrode polysilicon is formed by depositing undoped polysilicon and doping the undoped polysilicon with dopants.

4. A process in accordance with claim 1, wherein said first storage electrode polysilicon and the polysilicon spacer are made of undoped polysilicon, thus to improve their etch selectivity relative to oxide.

5. A process in accordance with claim 1, wherein said first storage electrode polysilicon and the polysilicon spacer are doped with impurities by impurity-diffusion through an annealing treatment of dielectric layer growth, thus to allow them to play a role of storage electrode.

6. A process in accordance with claim 1, wherein said spacer-shaped solid cylinder of the pattern of second storage electrode is split by controlling its thickness and the thickness of the sacrificial oxide spacer.

7. A process in accordance with claim 6, wherein said wet etching for the removal of said sacrificial oxide spacer is conducted in the absence of the silicon nitride, to form an undercut portion beneath the storage electrode through utilization of differences in etch selectivity between the insulating film and the sacrificial oxide spacer.

8. A process in accordance with claim 1, wherein said dielectric layer is selected from a group consisting of a nitride-oxide composite layer, an oxide-nitride-oxide composite and a tantalum oxide ($Ta_2O_3$) layer.

9. A process in accordance with claim 1, wherein said plate electrode is made of polysilicon, polycide or similar conductive material.

10. A process in accordance with claim 1, wherein said insulating oxide film is an impurity-doped insulating oxide film.

11. A process in accordance with claim 1, wherein said mask for contact hole and said mask for electrode are sequentially subjected to photolithography, such that double light exposure is effected.

* * * * *